United States Patent
Lee et al.

(10) Patent No.: US 8,538,748 B2
(45) Date of Patent: Sep. 17, 2013

(54) METHOD AND APPARATUS FOR ENHANCING VOICE SIGNAL IN NOISY ENVIRONMENT

(75) Inventors: Nam-il Lee, Suwon-si (KR); Yang-su Kim, Suwon-si (KR); Beak-kwon Son, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 270 days.

(21) Appl. No.: 12/957,941

(22) Filed: Dec. 1, 2010

(65) Prior Publication Data

US 2011/0137647 A1 Jun. 9, 2011

(30) Foreign Application Priority Data

Dec. 4, 2009 (KR) .................. 10-2009-0119916

(51) Int. Cl.
*G10L 21/02* (2013.01)

(52) U.S. Cl.
USPC .......................................... 704/226

(58) Field of Classification Search
USPC .......................................... 704/226
See application file for complete search history.

(56) References Cited

U.S. PATENT DOCUMENTS 5,615,256 A 3/1997 Yamashita
6,094,481 A 7/2000 Deville et al.

FOREIGN PATENT DOCUMENTS

JP 2005-252538 A 9/2005

*Primary Examiner* — Susan McFadden
(74) *Attorney, Agent, or Firm* — Sughrue Mion, PLLC

(57) ABSTRACT

A method and apparatus which enhance a voice signal received by a reception terminal from a transmission terminal, the method including: detecting a magnitude of a noise signal peripheral to the reception terminal; checking a volume level which is set in the reception terminal while the voice signal is received from the transmission terminal; and adaptively enhancing at least one of a volume and an articulation of the voice signal on the basis of a magnitude of the noise signal and the checked volume level.

16 Claims, 5 Drawing Sheets

METHOD AND APPARATUS FOR ENHANCING VOICE SIGNAL IN NOISY ENVIRONMENT

CROSS-REFERENCE TO RELATED PATENT APPLICATION

This application claims priority from Korean Patent Application No. 10-2009-0119916, filed on Dec. 4, 2009 in the Korean Intellectual Property Office, the disclosure of which is incorporated herein in its entirety by reference.

BACKGROUND

1. Field

Apparatuses and methods consistent with the exemplary embodiments relate to a method and apparatus which enhance a voice signal, and more particularly, to a method and apparatus which enhance a voice signal that is received from a transmission terminal in a reception terminal that is in a noisy environment.

2. Description of the Related Art

As portable terminals are in wide supply, users may talk over portable terminals anywhere they wish. However, when the user of a reception terminal is in a noisy environment, it is difficult for the user to recognize a voice signal that is received from a transmission terminal. Accordingly, the user should amplify the volume level of the reception terminal to increase the volume of a received voice signal so as to accurately recognize the received voice signal. Due to the inconvenience for a user when the user directly controls a volume level in the noisy environment, a method has been proposed in which a reception terminal enhances and outputs a voice signal that is received from a transmission terminal according to the magnitude of a peripheral noise signal.

SUMMARY

The exemplary embodiments provide a method and apparatus which enhance a voice signal that is received from a transmission terminal in a reception terminal that is in a noisy environment.

According to an aspect of an exemplary embodiment, there is provided a method of enhancing a voice signal received by a reception terminal from a transmission terminal in a noisy environment, the method including: detecting a magnitude of a noise signal peripheral to the reception terminal; checking a volume level which is set in the reception terminal while the voice signal is received from the transmission terminal; and adaptively enhancing at least one of a volume and an articulation of the voice signal, on the basis of a magnitude of the noise signal and the checked volume level.

According to an aspect of another exemplary embodiment, there is provided an apparatus which enhances a voice signal received from a transmission terminal in a noisy environment, the apparatus including: a noise detection unit which detects a magnitude of a noise signal peripheral to a reception terminal; a voice reception unit which receives the voice signal from the transmission terminal; a volume level check unit which checks a volume level which is set in the reception terminal while the voice signal is received from the transmission terminal; and a voice enhancement unit which adaptively enhances at least one of a volume and an articulation of the voice signal, on the basis of a magnitude of the noise signal and the checked volume level.

According to an aspect of another exemplary embodiment, there is provided a method of enhancing a voice signal received by a reception terminal from a transmission terminal in a noisy environment, the method including: detecting a noise signal peripheral to the reception terminal; checking a volume level which is set in the reception terminal while the voice signal is received from the transmission terminal; and adaptively enhancing a volume of the voice signal, on the basis of the detected noise signal and the checked volume level.

According to an aspect of another exemplary embodiment, there is provided a method of enhancing a voice signal received by a reception terminal from a transmission terminal in a noisy environment, the method including: detecting a noise signal peripheral to the reception terminal; checking a volume level which is set in the reception terminal while the voice signal is received from the transmission terminal; and adaptively enhancing an articulation of the voice signal, on the basis of the detected noise signal and the checked volume level.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EXEMPLARY EMBODIMENTS

The exemplary embodiments will now be described more fully with reference to the accompanying drawings. Expressions such as "at least one of," when preceding a list of elements, modify the entire list of elements and do not modify the individual elements of the list.

Figure 1:
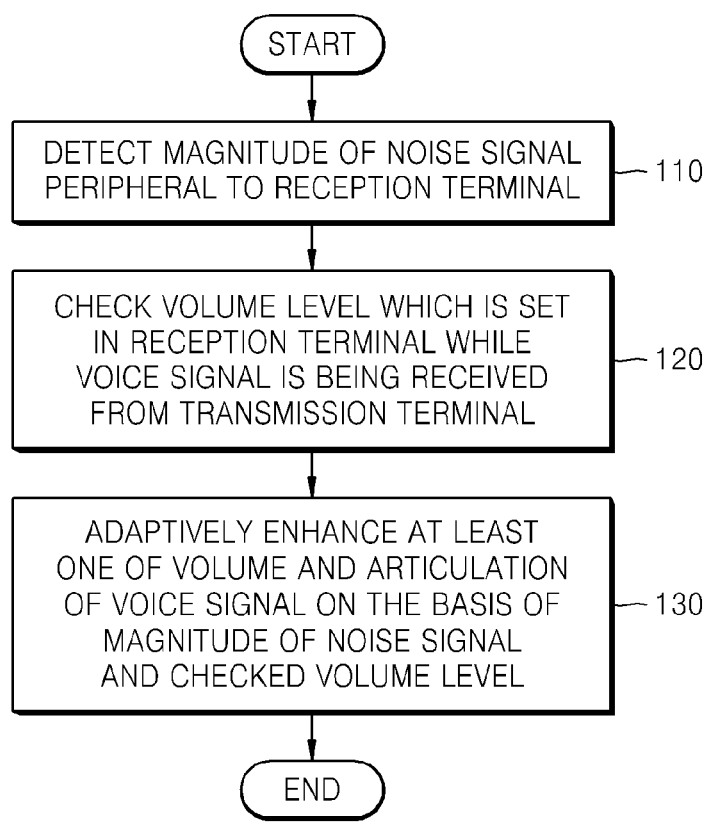
FIG. 1 is a flow chart illustrating a method of enhancing a voice signal that is received by a reception terminal in a noisy environment, from a transmission terminal, according to an exemplary embodiment.

FIG. 1 is a flow chart illustrating a method of enhancing a voice signal that is received by a reception terminal in a noisy environment, from a transmission terminal, according to an exemplary embodiment. Referring to FIG. 1, the reception terminal detects a magnitude of a peripheral noise signal in operation 110.

At this point, the magnitude of the noise signal may be obtained by detecting the magnitude of the noise signal that is received by the reception terminal before receiving a voice signal from a user and a voice signal from a transmission terminal. More specifically, the magnitude of the noise signal may be detected by converting the noise signal that is received from the periphery of the transmission terminal into a frequency domain and detecting the energy magnitude of the noise signal that has been converted into the frequency domain. For example, Fast Fourier Transform (FFT) may be applied to the noise signal to convert the noise signal into the frequency domain.

In another exemplary embodiment, the magnitude of the noise signal may be newly detected using a received noise signal per bundle section, that is, a section in which only a noise signal from the periphery of a reception terminal is received by the reception terminal because a voice signal from a user and a voice signal from a transmission terminal are not received by the reception terminal.

While a voice signal is being received from a transmission terminal, a volume level that is set in the reception terminal is checked in operation 120. At this point, the number of volume levels may be differently determined for each reception terminal. For example, the volume level of the reception terminal may be divided into seven levels from a level 1 to a level 7. In an exemplary embodiment, a volume level is checked in order to consider the volume level when enhancing a voice signal, as described below.

The reception terminal adaptively enhances at least one of the volume and articulation of the voice signal on the basis of the detected magnitude of the noise signal and the checked volume level in operation 130. At this point, as the magnitude of the noise signal increases, the reception terminal enhances at least one of the volume and articulation of the voice signal. That is, as the magnitude of the noise signal increases, it becomes difficult for the user to recognize the voice signal. Therefore, the reception terminal enhances at least one of the volume and articulation of the voice signal and thereby increases the magnitude of the voice signal, enabling the user to better recognize the voice signal that is received by the reception terminal.

Hereinafter, a related art volume enhancing method and a volume enhancing method according to an exemplary embodiment will be described with reference to FIGS. 2 through 4.

Figure 2:
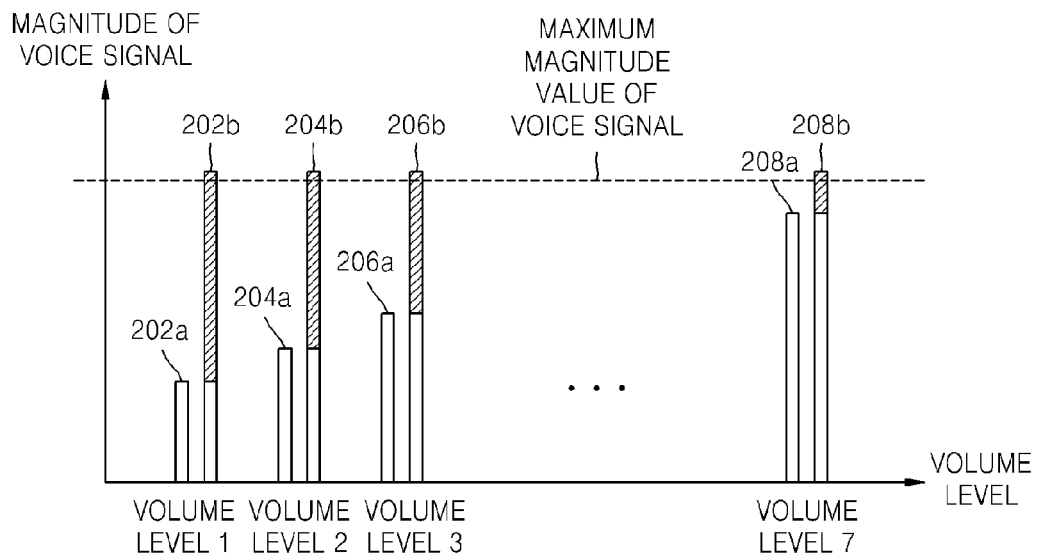
FIG. 2 is a diagram for describing an example of a related art method of enhancing voice signal volume.

FIG. 2 is a diagram for describing an example of a related method of enhancing voice signal volume. Referring to FIG. 2, the magnitudes 202a, 204a, 206a and 208a of a current voice signal for volume levels 1 to 3 and 7 among seven volume levels and the magnitudes 202b, 204b, 206b and 208b of a voice signal after the volume is enhanced, are illustrated. At this point, a dotted-line portion represents the maximum magnitude value of a voice signal that a reception terminal may output. That is, the reception terminal's hardware does not output a voice signal having a greater magnitude than the maximum magnitude value of the voice signal that is indicated by the dotted line.

In FIG. 2, a voice signal volume is enhanced so that all the magnitudes 202a, 204a, 206a and 208a of the voice signal become the maximum magnitude value of the voice signal of the reception terminal, irrespective of volume levels and the magnitudes 202a, 204a, 206a and 208a of the voice signal in the volume levels. When the voice signal volume thus increases, the magnitude of the voice signal suddenly increases to the maximum magnitude value of the voice signal even while a user is talking over the reception terminal at a low volume level. Thus, the user, who is talking over the reception terminal at the magnitudes 202b, 204b and 206b of a voice signal having a low volume level, may be surprised or experience discomfort.

Figure 3:
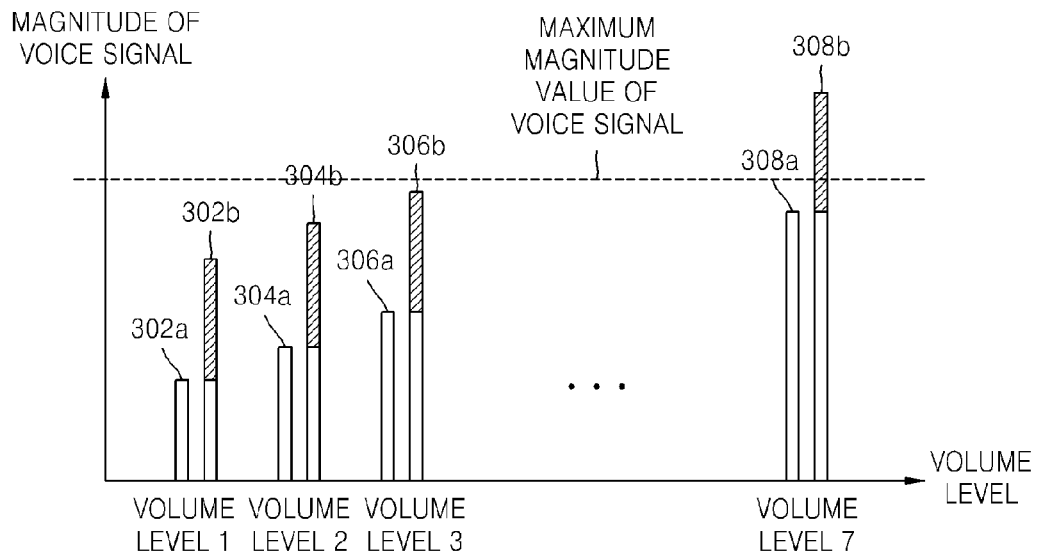
FIG. 3 is a diagram for describing another example of a related art method of enhancing voice signal volume.

FIG. 3 is a diagram for describing another example of a related art method of enhancing voice signal volume. Referring to FIG. 3, the magnitudes 302a, 304a, 306a and 308a of a current voice signal for volume levels 1 to 3 and 7 among seven volume levels and the magnitudes 302b, 304b, 306b and 308b of a voice signal after the volume is enhanced, are illustrated.

In FIG. 3, all the magnitudes 302a, 304a, 306a and 308a of the voice signal are enhanced by up to a same amount that a volume in a volume level 1 is enhanced, irrespective of volume levels and the magnitudes 302a, 304a, 306a and 308a of the voice signal in the volume levels. When the volume of a voice signal is thus enhanced, a volume may increase to a sufficient magnitude in the volume level 1, but the magnitude 308b of a volume-enhanced voice signal cannot be enlarged to a value greater than the maximum magnitude value of the voice signal. Therefore, the magnitude 308a of the voice signal in which a volume is enhanced in the volume level 7 cannot increase by up to a same amount that a volume that is enhanced in the volume level 1, and moreover, the sound quality of the enhanced voice signal may be degraded.

Figure 4:
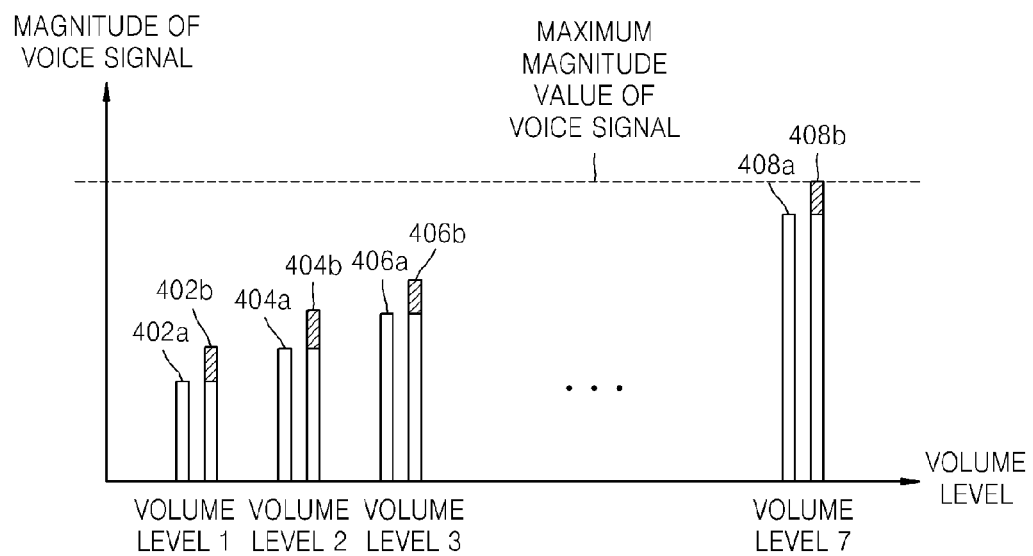
FIG. 4 is a diagram for describing another example of a related art method of enhancing voice signal volume.

FIG. 4 is a diagram for describing another example of a related method of enhancing voice signal volume. Referring to FIG. 4, the magnitudes 402a, 404a, 406a and 408a of a current voice signal for volume levels 1 to 3 and 7 among seven volume levels and the magnitudes 402b, 404b, 406b and 408b of a voice signal after the volume is enhanced, are illustrated.

In FIG. 4, all the magnitudes 402a, 404a, 406a and 408a of the voice signal are enhanced by up to a same amount that a volume in a volume level 7 is enhanced, irrespective of volume levels and the magnitudes 402a, 404a, 406a and 408a of the voice signal in the volume levels. When the volume of a voice signal is thus enhanced, a volume may increase to the maximum magnitude value of the voice signal in the volume level 7, but the volume of the voice signal cannot sufficiently increase in a low volume level such as the volume level 1.

For solving limitations described above with reference to FIGS. 2 through 4, adaptively increasing a volume according to the volume level of a reception terminal is required.

Figure 5:
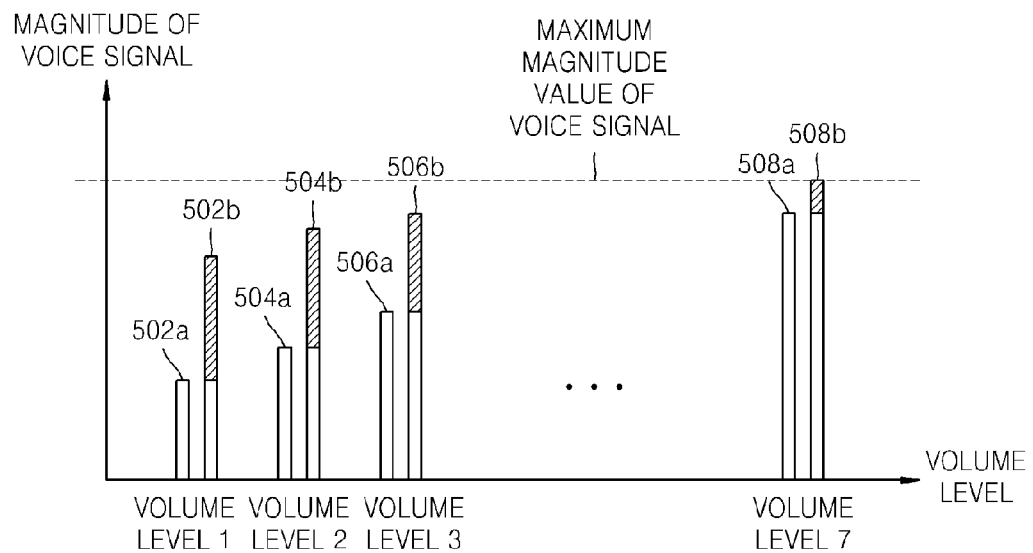
FIG. 5 is a diagram for describing a method of enhancing voice signal volume, according to an exemplary embodiment.

FIG. 5 is a diagram for describing a method of enhancing voice signal volume, according to an exemplary embodiment. Referring to FIG. 5, the increase in magnitude of a volume is changed according to volume levels. More specifically, in FIG. 5, as a volume level is reduced, the volume of a voice signal is enhanced more. Thus, the volumes of voice signals 502a, 504a and 506a in a low volume level increase sufficiently, and moreover, the volume of a voice signal 508a in a high volume level increases within a range in which the magnitude of the voice signal 508a after the volume is enhanced is not greater than the maximum magnitude value of the voice signal. Accordingly, the sound quality of the enhanced voice signal is not degraded.

At this point, in another exemplary embodiment, the maximum magnitude value of a voice signal that a reception terminal may output for each volume level may be determined. For example, in FIG. 5, the magnitudes 502b, 504b, 506b and 508b of voice signals that are enhanced for each volume level are illustrated. It may be assumed that the magnitudes 502b, 504b, 506b and 508b of the enhanced voice signals in FIG. 5 are the maximum magnitude value of the voice signal which the reception terminal may output for each volume level. In this way, when the maximum magnitude value of the voice signal which the reception terminal may output for each volume level is determined, the voice signal volume does not increase to a value greater than the maximum magnitude value of the voice signal that is set for each volume level regardless of how large the magnitude of a noise signal received by the reception terminal becomes. In contrast, the related art methods of enhancing voice signal volume illustrated in FIGS. 2 through 4 have the same maximum magnitude value of the voice signal in the volume levels 1 to 7.

In another exemplary embodiment, a voice signal may be enhanced so that the magnitude of an enhanced voice signal does not exceed the maximum magnitude value of a voice signal corresponding to a checked volume level, on the basis of maximum voice magnitude information for each volume that represents the maximum magnitude value of the voice signal which a reception terminal may output for each volume level. At this point, the maximum voice magnitude information for each volume may be generated by being calculated in real time in the reception terminal, and may be read from the reception terminal.

Up to now, a method of enhancing voice signal volume has been described. Hereinafter, a method of enhancing voice signal articulation will now be described with reference to FIGS. 6 and 7.

Figure 6:
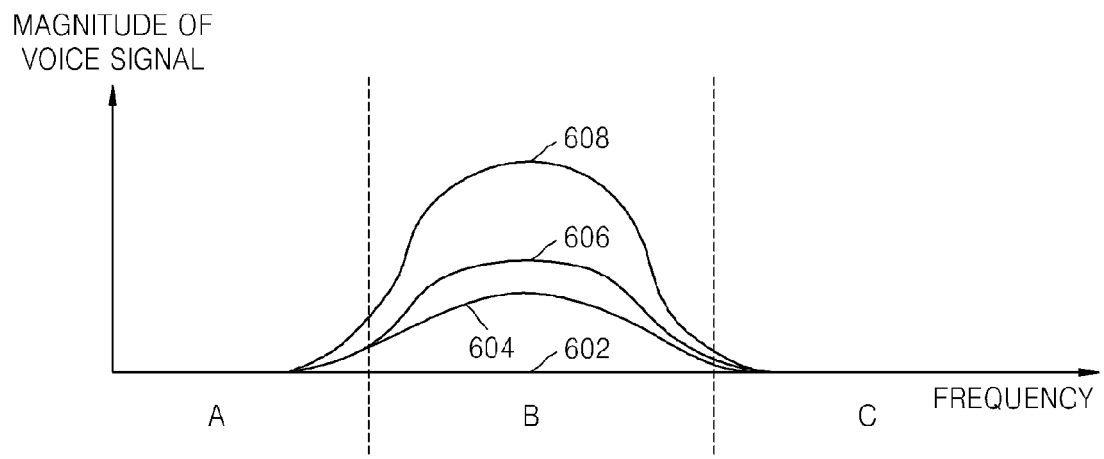
FIG. 6 is a diagram for describing a method of enhancing voice signal articulation, according to an exemplary embodiment.

FIG. 6 is a diagram for describing a method of enhancing voice signal articulation, according to an exemplary embodiment. In the present exemplary embodiment, the articulation of a voice signal denotes a degree of clearness of the voice signal, and enhancing the articulation of the voice signal denotes an operation that improves the quality of the voice signal for a user to more clearly recognize the voice signal when it becomes difficult for the user to recognize the voice signal due to noise.

Referring to FIG. 6, frequency bands for a voice signal are divided into a frequency band A, a frequency band B and a frequency band C. It is understood that such a division of frequency bands is provided as non-limiting and exemplary for convenience of description, and the frequency bands for the voice signal may be subdivided differently in another exemplary embodiment. At this point, the frequency band A, the frequency band B, and the frequency band C may be referred to as super high frequency bands.

In this way, when enhancing only the volume of a voice signal that is included in the frequency band B among the frequency bands A, B and C, the articulation of the voice signal can be enhanced. That is, enhancing the voice signal volume denotes enhancing the volume of all the frequency bands of the voice signal, and enhancing the articulation of the voice signal refers to enhancing only the volume of a voice signal that is included in a portion of the frequency bands for the voice signal.

Generally, when enhancing only the volume of a voice signal that is included in a high frequency band, the voice signal articulation is enhanced. Accordingly, in an exemplary embodiment, the volume of a voice signal that is included in the frequency band B is enhanced.

In the frequency band B of FIG. 6, graphs 602, 604, 606 and 608 that represent gains to be applied to a voice signal included in the frequency band B are illustrated. Herein, as the graphs project toward the upward direction of an axis that represents the magnitude of a voice signal, gains become larger, and thus articulation can be more enhanced. For example, since a graph 602 has a gain of 1, although a gain corresponding to a graph 602 is applied to a voice signal, articulation is not enhanced. As gains increase from a graph 604 toward a graph 608, articulation is most largely enhanced when a gain corresponding to the graph 608 is applied to the voice signal.

In another exemplary embodiment, voice signal articulation may be enhanced by using an equalizer to enhance only the volumes of the voices signals of the frequency band B.

According to an exemplary embodiment, as the volume level of a reception terminal becomes higher, the articulation of a voice signal may be more enhanced. This will be described below with reference to FIG. 7.

Figure 7:
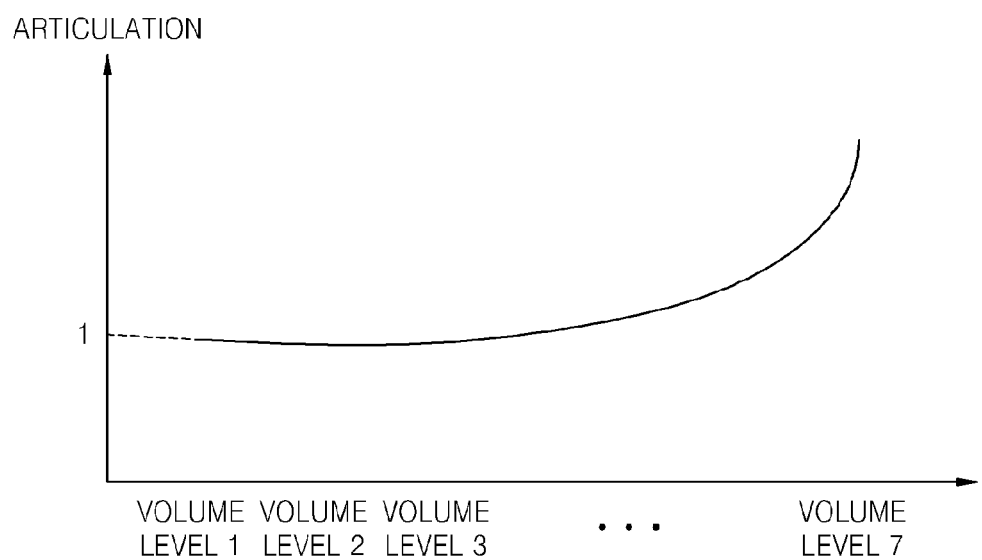
FIG. 7 is a diagram for describing a relationship between a volume level and an articulation of a voice signal, according to an exemplary embodiment.

FIG. 7 is a diagram for describing a relationship between a volume level and an articulation of a voice signal, according to an exemplary embodiment. Referring to FIG. 7, as a volume level becomes higher, the magnitude of the articulation of a voice signal increases in an exponential function. In an exemplary embodiment, the reason that the relationship between a volume level and the articulation of a voice signal is set in this way is as follows. Since the increase in width of the voice signal volume is broad in a low volume level, the voice signal volume is directly increased without enhancing the articulation of the voice signal. However, as a volume level becomes higher, a volume cannot sufficiently be enhanced because the increase in width of the voice signal volume becomes narrower due to the hardware limits of a device. Therefore, the exemplary embodiments relate to increasing the articulation of the voice signal.

Figure 8:
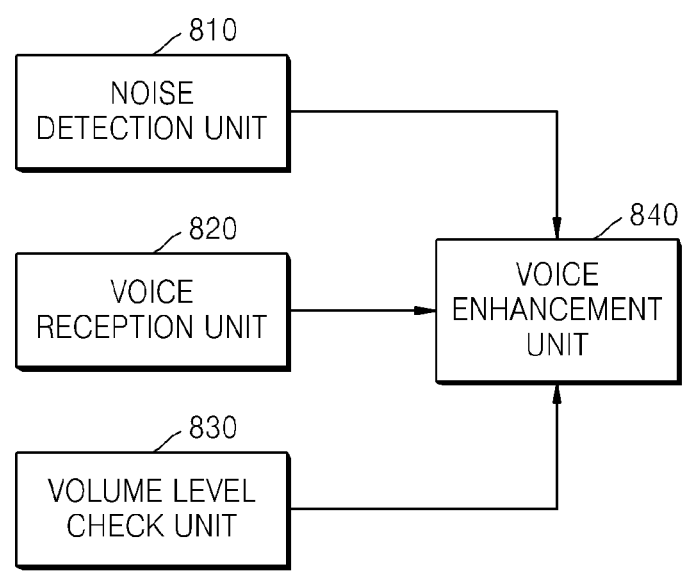
FIG. 8 is a block diagram illustrating an apparatus which enhances a voice signal received by a reception terminal in a noisy environment, from a transmission terminal, according to an exemplary embodiment.

FIG. 8 is a block diagram illustrating an apparatus which enhances a voice signal received by a reception terminal in a noisy environment, from a transmission terminal, according to an exemplary embodiment. Referring to FIG. 8, the apparatus which enhances a voice signal includes a noise detection unit 810, a voice reception unit 820, a volume level check unit 830, and a voice enhancement unit 840. Herein, it is assumed that the apparatus which enhances a voice signal is mounted on a reception terminal (not shown).

The noise detection unit 810 detects the magnitude of a noise signal peripheral to the reception terminal. The noise detection unit 810 may detect the magnitude of the noise signal by detecting the magnitude of the noise signal that is received by the reception terminal before a voice signal from a user and a voice signal from a transmission terminal are received by the reception terminal. More specifically, the noise detection unit 810 may detect the magnitude of the noise signal by converting a noise signal that is received from the periphery of the transmission terminal into the frequency domain and detecting the energy magnitude of the noise signal that has been converted into the frequency domain.

In another exemplary embodiment, the noise detection unit 810 may newly detect the magnitude of the noise signal by using a received noise signal per bundle section, that is, a section in which only a noise signal from the periphery of a reception terminal is received by the reception terminal because a voice signal from a user and a voice signal from a transmission terminal are not received by the reception terminal.

The voice reception unit 820 receives a voice signal from the transmission terminal.

The volume level check unit 830 checks a volume level that is set in the reception terminal while a voice signal is being received.

The voice enhancement unit 840 adaptively enhances at least one of the volume and articulation of the voice signal, on the basis of the detected magnitude of the noise signal and the checked volume level.

While not restricted thereto, the exemplary embodiments can be written as computer programs and can be implemented in general-use digital computers that execute the programs using a computer readable recording medium. Examples of the computer readable recording medium include magnetic storage media (e.g., ROM, floppy disks, hard disks, etc.), and optical recording media (e.g., CD-ROMs, or DVDs). Also, the exemplary embodiments may be written as computer programs transmitted over a computer-readable transmission medium, such as a carrier wave, and received and implemented in general-use digital computers that execute the programs. Moreover, while not required in all aspects, one or more units of the apparatus which enhances a voice signal can include a processor or microprocessor executing a computer program stored in a computer-readable medium, such as a local storage.

While this invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the exemplary embodiments but by the appended claims, and all differences within the scope will be construed as being included in the present invention.

What is claimed is:

1. A method of enhancing a voice signal received by a reception terminal from a transmission terminal, the method comprising:
   detecting a magnitude of a noise signal peripheral to the reception terminal;
   checking a volume level which is set in the reception terminal while the voice signal is received from the transmission terminal; and
   increasing, in the reception terminal, at least one of a volume of the voice signal included in each of a plurality of frequency bands and a volume of a portion of the voice signal included in a portion less than all of the frequency bands, on the basis of the magnitude of the noise signal and the checked volume level.

2. The method of claim 1, wherein the increasing at least one of the volume of the voice signal and the volume of the portion of the voice signal comprises:
   increasing the volume of the voice signal by a first amount when the checked volume level is a first level; and
   increasing the volume of the voice signal by a second amount, less than the first amount, when the checked volume level is a second level, greater than the first level.

3. The method of claim 1, wherein the increasing at least one of the volume of the voice signal and the volume of the portion of the voice signal comprises:
   increasing the volume of the portion of the voice signal by a first amount when the checked volume level is a first level; and
   increasing the volume of the portion of the voice signal by a second amount, greater than the first amount, when the checked volume level is a second level, greater than the first level.

4. The method of claim 1, wherein the increasing at least one of the volume of the voice signal and the volume of the portion of the voice signal comprises:
   increasing the volume of the portion of the voice signal by a first amount when the checked volume level is a first level; and
   increasing the volume of the portion of the voice signal by a second amount, exponentially greater than the first amount, when the checked volume level is a second level, greater than the first level.

5. The method of claim 1, wherein the increasing at least one of the volume of the voice signal and the volume of the portion of the voice signal comprises:
   increasing at least one of the volume of the voice signal and the volume of the portion of the voice signal by a first amount when the magnitude of the noise signal has a first value; and
   increasing at least one of the volume of the voice signal and the volume of the portion of the voice signal by a second amount, greater than the first amount, when the magnitude of the noise signal has a second value greater than the first value.

6. The method of claim 1, wherein the increasing at least one of the volume of the voice signal and the volume of the portion of the voice signal comprises:
   increasing at least one of the volume of the voice signal and the volume of the portion of the voice signal such that a magnitude of the increased voice signal or the increased portion of the voice signal does not exceed a maximum magnitude value of the voice signal corresponding to the checked volume level, on the basis of maximum voice magnitude information for each volume which represents the maximum magnitude value of the voice signal which the reception terminal outputs for each volume level.

7. The method of claim 1, wherein the increasing of the volume of the portion of the voice signal comprises:
   dividing the voice signal into the plurality of frequency bands for the voice signal; and
   increasing the volume of the portion of the voice signal comprised in a first frequency band of the plurality of frequency bands.

8. The method of claim 1, wherein the detecting the magnitude of the noise signal comprises detecting the magnitude of the noise signal received by the reception terminal before receiving a voice signal from a user and the voice signal from the transmission terminal.

9. The method of claim 8, wherein the detecting the magnitude of the noise signal received by the reception terminal before receiving the voice signal from the user and the voice signal from the transmission terminal comprises detecting the magnitude of the noise signal by converting the noise signal into a frequency domain and detecting an energy magnitude of the converted noise signal.

10. An apparatus which enhances a voice signal received from a transmission terminal, the apparatus comprising:
    a noise detection unit comprising a processor which detects a magnitude of a noise signal peripheral to a reception terminal;
    a voice reception unit which receives the voice signal from the transmission terminal;
    a volume level check unit which checks a volume level which is set in the reception terminal while the voice signal is received from the transmission terminal; and
    a voice enhancement unit which increases at least one of a volume of the voice signal included in each of a plurality of frequency bands and a volume of a portion of the voice signal included in a portion less than all of the frequency bands, on the basis of the magnitude of the noise signal and the checked volume level.

11. The apparatus of claim 10, wherein the voice enhancement unit increases the volume of the voice signal by a first amount when the checked volume level is a first level, and increases the volume of the voice signal by a second amount, less than the first amount, when the checked volume level is a second level, greater than the first level.

12. The apparatus of claim 10, wherein the voice enhancement unit increases the volume of the portion of the voice signal by a first amount when the checked volume level is a first level, and increases the volume of the portion of the voice signal by a second amount, greater than the first amount, when the checked volume level is a second level, greater than the first level.

13. The apparatus of claim 10, wherein the voice enhancement unit increases the volume of the portion of the voice signal by a first amount when the checked volume level is a first level, and increases the volume of the portion of the voice signal by a second amount, exponentially greater than the first amount, when the checked volume level is a second level, greater than the first level.

14. The apparatus of claim 10, wherein the voice enhancement unit increases at least one of the volume of the voice signal and the volume of the portion of the voice signal by a first amount when the magnitude of the noise signal has a first value, and increases at least one of the volume of the voice signal and the volume of the portion of the voice signal by a second amount, greater than the first amount, when the magnitude of the noise signal has a second value greater than the first value.

15. The apparatus of claim 10, wherein the voice enhancement unit increases at least one of the volume of the voice signal and the volume of the portion of the voice signal such that a magnitude of the increased volume of the voice signal or the increased volume of the portion does not exceed a maximum magnitude value of the voice signal corresponding to the checked volume level, on the basis of maximum voice magnitude information for each volume which represents the maximum magnitude value of the voice signal which the reception terminal outputs for each volume level.

16. A non-transitory computer-readable recording medium storing a program for executing the method of claim 1.

* * * * *